(12) United States Patent
Ueta et al.

(10) Patent No.: US 9,282,644 B2
(45) Date of Patent: Mar. 8, 2016

(54) PHOTOSENSITIVE RESIN COMPOSITION, CURED PRODUCT THEREOF, AND PRINTED WIRING BOARD

(71) Applicant: TAIYO HOLDINGS CO., LTD., Nerima-ku (JP)

(72) Inventors: Chiho Ueta, Hiki-gun (JP); Seiryo Kamata, Hiki-gun (JP)

(73) Assignee: TAIYO HOLDINGS CO., LTD., Nerima-ku (JP)

( * ) Notice: Subject to any disclaimer, the term of this patent is extended or adjusted under 35 U.S.C. 154(b) by 0 days.

(21) Appl. No.: 14/470,059

(22) Filed: Aug. 27, 2014

(65) Prior Publication Data

US 2014/0360758 A1 Dec. 11, 2014

Related U.S. Application Data

(63) Continuation of application No. 13/497,923, filed as application No. PCT/JP2010/005776 on Sep. 24, 2010, now abandoned.

(30) Foreign Application Priority Data

Sep. 29, 2009 (JP) ................. 2009-225059

(51) Int. Cl.
| | |
|---|---|
| *H05K 3/00* | (2006.01) |
| *H05K 3/28* | (2006.01) |
| *H05K 1/02* | (2006.01) |
| *H05K 1/03* | (2006.01) |
| *G03F 7/105* | (2006.01) |
| *G03F 7/032* | (2006.01) |
| *G03F 7/00* | (2006.01) |

(52) U.S. Cl.
CPC ............ *H05K 3/0076* (2013.01); *G03F 7/0007* (2013.01); *G03F 7/032* (2013.01); *G03F 7/105* (2013.01); *H05K 1/0296* (2013.01); *H05K 1/0373* (2013.01); *H05K 3/0055* (2013.01); *H05K 3/287* (2013.01); *H05K 2203/161* (2013.01); *Y10T 428/31938* (2015.04)

(58) Field of Classification Search
None
See application file for complete search history.

(56) References Cited

U.S. PATENT DOCUMENTS

| | | | |
|---|---|---|---|
| 2004/0157140 A1 | 8/2004 | Kamata et al. | |
| 2008/0171271 A1 * | 7/2008 | Kim et al. | ......................... 430/7 |

FOREIGN PATENT DOCUMENTS

| | | |
|---|---|---|
| CN | 1928714 A | 3/2007 |
| CN | 101128774 A | 2/2008 |
| CN | 101281368 A | 10/2008 |
| CN | 101546123 A | 9/2009 |
| JP | 06-289602 | 10/1994 |
| JP | 2002-294131 | 10/2002 |
| JP | 2004-317850 A | 11/2004 |
| JP | 2005-321587 | 11/2005 |
| JP | 2006-162858 | 6/2006 |
| JP | 2006-235153 | 9/2006 |
| JP | 2007-71994 | 3/2007 |
| JP | 2008-257045 | 10/2008 |
| JP | 2009-258613 | 11/2009 |

OTHER PUBLICATIONS

International Search Report Issued Oct. 19, 2010 in PCT/JP10/05776 Filed Sep. 24, 2010.
International Preliminary Report on Patentability and Written Opinion issued Apr. 12, 2012 in Application No. PCT/JP2010/005776.
Combined Chinese Office Action and Search Report issued Jul. 18, 2013 in Patent Application No. 201080043075.8 with Partial English Translation and English Translation of Category of Cited Documents.
Random House Dictionary, Definition of "film", Random House, Inc. 2014, pp. 1-3.

* cited by examiner

*Primary Examiner* — Sheeba Ahmed
(74) *Attorney, Agent, or Firm* — Oblon, McClelland, Maier & Neustadt, L.L.P.

(57) ABSTRACT

Disclosed is a photosensitive resin composition which has excellent concealing properties for appearance defects of a circuit and the like, while having excellent coloring power and resolution that enable the formation of a high-resolution solder resist layer. Specifically disclosed is a photosensitive resin composition which contains a perylene coloring agent, a coloring agent that is in a complementary color relation with the perylene coloring agent, a carboxyl group-containing resin, a compound that contains two or more ethylenically unsaturated groups in each molecule, and a photopolymerization initiator.

18 Claims, 1 Drawing Sheet

(A)  (B)

PHOTOSENSITIVE RESIN COMPOSITION, CURED PRODUCT THEREOF, AND PRINTED WIRING BOARD

CROSS-REFERENCE TO RELATED APPLICATIONS

The present application is a continuation of and claims the benefit of priority to U.S. application Ser. No. 13/497,923, filed Mar. 23, 2012, which is a National Stage of PCT/JP2010/005776, filed Sep. 24, 2010, which is based on and claims the benefit of priority to Japanese Application No. 2009-225059, filed Sep. 29, 2009. The entire contents of these applications are incorporated herein by reference.

TECHNICAL FIELD

The present invention relates to a photosensitive resin composition and a cured product thereof, and a printed wiring board having a solder resist layer composed of the cured product.

BACKGROUND ART

Alkali-developing type photosensitive resin compositions are widely used as solder resists for printed wiring boards. The solder resists aim at protecting circuits of printed wiring boards, and the tinting strength thereof is an important property that significantly affects the appearance of printed wiring boards and the concealing property of circuits.

Namely, when a solder resist has insufficient tinting strength, contamination and discoloring of a copper circuit formed on a printed wiring board become prominent, which decreases the appearance of the printed wiring board significantly. Furthermore, a step of mounting, which is a post step in the production of printed wiring boards, has been automated recently, and parts are attached by machines; however, a defect that a solder resist and a copper circuit cannot be recognized well during image recognition occurs. This phenomenon is also problematic in AOI (Automatic Optical Inspection) that is a final inspection of printed wiring boards.

On the other hand, as the photosensitive property of photosolder resists that are currently available in the market, general resists have a film thickness of around 20 μm and resolution property with a line width of from about 30 μm to 50 μm.

However, although conventional black solder resists are preferable in view of tinting strength (concealing property), they have problems that they have an insufficient curing depth and cannot form fine lines since a black coloring agent having absorbance from the ultraviolet region to the infrared region has been added thereto. Generally, a carbon black coloring agent that is excellent in weather resistance is used as a black coloring agent; however, since this coloring agent has large absorption in the ultraviolet region, when the content thereof is much, it absorbs ultraviolet ray and affects on transmitting property, and thus fine resolution cannot be obtained.

Thus, it was difficult to provide a black photosensitive resin composition that can form a solder resist layer that simultaneously satisfies fine concealing property and high resolution property.

CITATION LIST

Patent Literature

PLT 1: Japanese Patent Application Laid-Open No. 2008-257045 (Claims)

SUMMARY OF THE INVENTION

Technical Problem

The present invention has been developed in view of the above-mentioned background art, and aims at providing a photosensitive resin composition that is excellent in tinting strength and resolution property, which is excellent in property of concealing the appearance defect and the like of a circuit and can form a solder resist layer having high resolution property.

Solution to Problem

The inventors of the present invention have done intensive studies and consequently found that the above-mentioned problem in resolution in conventional black solder resists is solved and a photosensitive resin composition having sufficient tinting strength can be obtained, by using a perylene coloring agent as a coloring agent and a coloring agent that is in a complementary color relation with the perylene coloring agent in combination, and completed the present invention.

Namely, in an aspect, the present invention is a photosensitive resin composition comprising a perylene coloring agent, a coloring agent that is in a complementary color relation with the perylene coloring agent, a carboxyl group-containing resin, a compound having two or more ethylenically unsaturated groups in a molecule, and a photopolymerization initiator.

In an aspect, in the above-mentioned photosensitive resin composition, a dry coating having a thickness of from 18 to 22 μm formed by using the photosensitive resin composition has a light absorbance of 0.5 or less at a wavelength of from 400 to 410 nm, and a cured product of the dry coating has an L* value of 40 or less and an a* value and a b* value that are each independently in the range of from −5 to 5 in the CIE L*a*b* Color Scale.

Furthermore, in another aspect, the present invention is a dry film comprising a coating obtained by applying and drying the above-mentioned photosensitive resin composition on a film.

Furthermore, in another aspect, the present invention is a cured product obtained by photo-curing a dry coating obtained by applying and drying the above-mentioned photosensitive resin composition on a substrate or a dry coating obtained by laminating a dry film obtained by applying and drying the above-mentioned photosensitive resin composition on a film on a substrate, by irradiating with an active energy ray.

Furthermore, in another aspect, the present invention is a printed wiring board having a pattern of a cured product obtained by photo-curing a dry coating obtained by applying and drying the above-mentioned photosensitive resin composition on a substrate or a dry coating obtained by laminating a dry film obtained by applying and drying the above-mentioned photosensitive resin composition on a film on a substrate, by irradiating with an active energy ray.

Advantageous Effects of Invention

The photosensitive resin composition of the present invention having high tinting strength and excellent resolution property has enabled provision of a solder resist layer that simultaneously satisfies high resolution property and excellent concealing property, which is demanded as a solder resist layer for printed wiring boards for which increasing of circuit thickness and increasing of density have been in progress.

DESCRIPTION OF EMBODIMENTS

Figure 1:
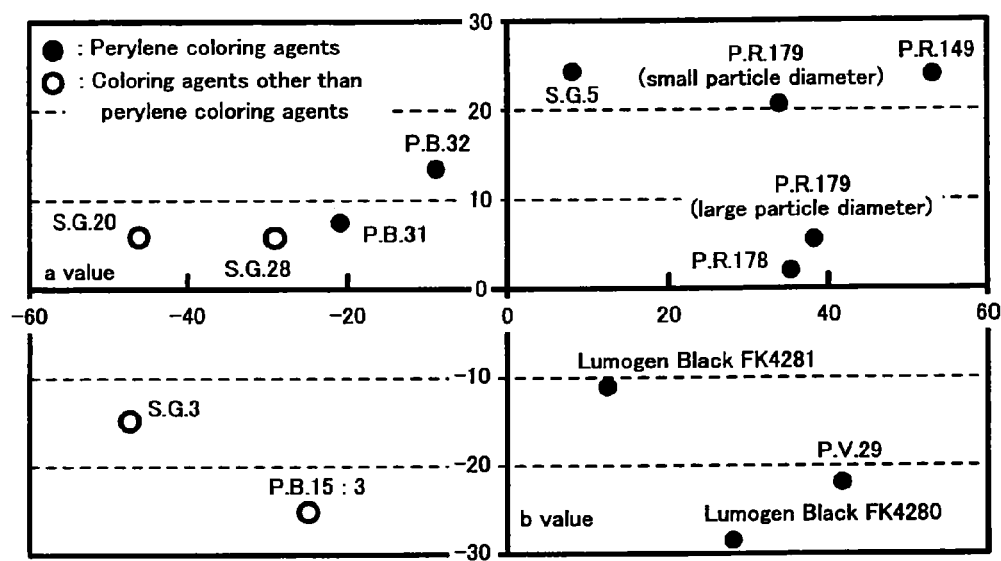
FIG. 1 is a drawing showing the a* and b* of the coloring agents.

Hereinafter the embodiments for carrying out the present invention will be explained in detail.

The photosensitive resin composition of the present embodiment is a photosensitive resin composition having a black color tone, which is characterized by using at least one kind of perylene coloring agent as a coloring agent and at least one kind of coloring agent that is in a complementary color relation with the perylene coloring agent (hereinafter also referred to as "complementary coloring agent") in combination, and a solder resist layer formed by using the photosensitive resin composition of the present embodiment has high resolution property and excellent concealing property.

Specifically, in the photosensitive resin composition of the present embodiment, the case when a dry coating having a thickness in the range of from 18 to 22 μm formed by using the composition has a light absorbance of 0.5 or less at any wavelength from 400 to 410 nm is preferable since finer deep portion-curability can be obtained. The light absorbance as used herein is a value obtained by measuring an absorption spectrum with an ultraviolet-visible spectrometer, and is a logarithm of a light transmittance. For example, a light absorbance of 1 corresponds to a transmittance of 10%. This light absorbance is more preferably from 0.05 to 0.3. When the light absorbance exceeds 0.5, sufficient deep portion-curability may not be obtained, whereas when the light absorbance is less than 0.05, photo-curing may be insufficient. Furthermore, in order to impart excellent concealing property, it is preferable to suitably select a combination of at least one kind of perylene coloring agent and at least one kind of coloring agent that is in a complementary color relation with the perylene coloring agent so that a light absorbance curve at the visible light region (450 to 800 nm) becomes a curve that approximates the light absorbance curve of carbon black.

Firstly, the coloring agents included in the photosensitive resin composition of the present embodiment will be explained.

(Coloring Agent)

Perylene Coloring Agent;

A perylene coloring agent imparts, when it is added to a photosensitive resin composition, high resolution property to a colored photoresist, specifically to a solder resist for printed wiring boards. The present invention is a photosensitive resin composition having a black color tone due to mixing of a perylene coloring agent and a complementary coloring agent, whereas carbon black that has been generally used as a black coloring agent until now has absorption at the whole wavelength regions and specifically has high light absorbance at around a wavelength of 405 nm, and thus cannot transmit sufficiently a light from a light source to the bottom part of a resist and decreases a curing depth. On the other hand, a perylene coloring agent has lesser absorbance at the ultraviolet region as compared to the above-mentioned carbon black, and thus can improve the resolution property of a solder resist. Since a perylene coloring agent has sufficient tinting strength, it can provide a black photosensitive resin composition that is excellent in resolution property and tinting strength by being mixed with a complementary coloring agent and used.

A known perylene coloring agent can be used as the perylene coloring agent that may be used in the present embodiment, and either of pigments, dyes and colors may be used as long as it is a perylene coloring agent.

Some perylene coloring agents show colors such as green, yellow, orange, red, purple and black, and examples may include those having the following numbers of the Color Index (C. I.; published by The Society of Dyers and Colourists).

Green: Solvent Green 5
Orange: Solvent Orange 55
Red: Solvent Red 135, 179, Pigment Red 123, 149, 166, 178, 179, 190, 194, 224
Purple: Pigment Violet 29
Black: Pigment Black 31, 32

Perylene coloring agents other than those mentioned above can also be used, and for example, Lumogen (registered trademark) Black FK4280 and Lumogen Black FK4281 manufactured by BASF, which do not have numbers of the Color Index but are known as near infrared ray-transmitting black organic pigments; Lumogen F Yellow 083, Lumogen F Orange 240, Lumogen F Red 305 and Lumogen F Green 850, which are known as light-collecting fluorescent dyes, and the like can also be used preferably since they have less absorption in the ultraviolet region and high tinting strength similarly to the other perylene compounds.

The incorporation ratio of the perylene coloring agent is preferably from 0.01 to 8 parts by mass, more preferably from 0.05 to 5 parts by mass, with respect to 100 parts by mass of the carboxyl group-containing resin mentioned below, with consideration for tinting property and an amount of absorption of an ultraviolet ray.

(Complementary Coloring Agent)

The complementary coloring agent that is used in combination with the perylene coloring agent in the present embodiment will be explained below. Firstly, the complementary color relation in the present embodiment will be explained.

Since a coloring agent does not necessarily present a color according to the Color Index color, the appearance color tone of the photosensitive resin composition is measured and represented by the method as prescribed in JISZ8729, the a* value and b* value that represent a color in the L*a*b* Color Scale are confirmed by coordinate axes (see FIG. 1), and a coloring agent for infinitely approximating the (a* value, b* value) of a coating obtained by combination with the perylene coloring agent (0, 0) is selected as a coloring agent in a complementary color relation. As used herein, the coating is a cured product of a dry coating in the range of from 18 to 22 μm. Furthermore, as the (a* value, b* value) that infinitely approximate (0, 0), the a* value and b* value are preferably in the range of from −5 to +5, respectively, and more preferably in the range of from −2 to +2. Furthermore, the coloring agent that is in a coloring agent in a complementary color relation may be a perylene coloring agent or a coloring agent other than perylene coloring agents.

The incorporation ratio in the photosensitive resin composition and the mixing ratio with the above-mentioned perylene coloring agent of the complementary coloring agent may be suitably selected within the range in which the color tone of the photosensitive resin composition presents a black color. As the incorporation ratio of the complementary coloring agent in the photosensitive resin composition, the ratio to the perylene coloring agent can be set preferably in the range from 0.01 to 8 parts by mass, more preferably from 0.05 to 5 parts by mass, with respect to 100 parts by mass of the carboxyl group-containing resin mentioned below. The specifics will be mentioned below.

The coloring agent that is in a complementary color relation with the perylene coloring agent as used herein may be any coloring agent (may be either a pigment, dye or colorant) as long as it can approximate the a* value and b* value in the color scale closer to 0 by the combination with the perylene coloring agent, and may include the coloring agents mentioned below. More preferable combinations with the perylene coloring agent are combinations of Pigment Red 149, 178, 179 with the green anthraquinone coloring agents mentioned below (Solvent Green 3, Solvent Green 20, Solvent Green 28 and the like), and other examples include combinations of the perylene coloring agents (Lumogen Black FK4281, Solvent Green 5) with phthalocyanine blue (Pigment Blue 15:3), and mixed colors (combinations) of perylene coloring agents including combinations of red perylene coloring agents (Pigment Red 149, 178, 179) and black perylene coloring agents (Pigment Black 31, 32), and combinations of black perylene coloring agents (Pigment Black 31, 32) and black perylene coloring agents (Lumogen Black FK4280, 4281).

Blue coloring agents include phthalocyanine and anthraquinone blue coloring agents, and pigment-based blue coloring agents may include compounds classified into Pigments, specifically compounds having the numbers of the Color Index (C. I.; published by The Society of Dyers and Colourists) as mentioned below.

Pigment-based blue coloring agents: Pigment Blue 15, 15:1, 15:2, 15:3, 15:4, 15:6, 16, 60.

As dye blue coloring agents, Solvent Blue 35, 45, 63, 67, 68, 70, 83, 87, 94, 97, 104, 122, 136 and the like can be used. Besides those mentioned above, metal-substituted or unsubstituted phthalocyanine coloring agents can also be used.

Similarly, green coloring agents include phthalocyanine, anthraquinone and perylene green coloring agents, and Pigment Green 7, 36, Solvent Green 3, 5, 20, 28 and the like can specifically be used. Besides those mentioned above, metal-substituted or unsubstituted phthalocyanine coloring agents can also be used.

Yellow coloring agents include anthraquinone, isoindolinone, condensed azo, benzimidazolone, monoazo, disazo yellow coloring agents and the like, and may specifically include the following ones.
(Anthraquinone Yellow Coloring Agents)
Solvent Yellow 163, Pigment Yellow 24, 108, 147, 193, 199, 202;
(Isoindolinone Yellow Coloring Agents)
Pigment Yellow 109, 110, 139, 179, 185;
(Condensed Azo Yellow Coloring Agents)
Pigment Yellow 93, 94, 95, 128, 155, 166, 180;
(Benzimidazolone Yellow Coloring Agents)
Pigment Yellow 120, 151, 154, 156, 175, 181;
(Monoazo Yellow Coloring Agents)
Pigment Yellow 1, 2, 3, 4, 5, 6, 9, 10, 12, 61, 62, 62:1, 65, 73, 74, 75, 97, 100, 104, 105, 111, 116, 167, 168, 169, 182, 183;
(Disazo Yellow Coloring Agents)
Pigment Yellow 12, 13, 14, 16, 17, 55, 63, 81, 83, 87, 126, 127, 152, 170, 172, 174, 176, 188, 198.

Red coloring agents include monoazo, disazo, azo lake, benzimidazolone, diketopyrrolopyrrole, condensed azo, anthraquinone, quinacridone red coloring agents and the like, and may specifically include the following ones.
(Monoazo Red Coloring Agents)
Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, 269;
(Disazo Red Coloring Agents)
Pigment Red 37, 38, 41;
(Monoazo Lake Red Coloring Agents)
Pigment Red 48:1, 48:2, 48:3, 48:4, 49:1, 49:2, 50:1, 52:1, 52:2, 53:1, 53:2, 57:1, 58:4, 63:1, 63:2, 64:1, 68;
(Benzimidazolone Red Coloring Agents)
Pigment Red 171, 175, 176, 185, 208;
(Diketopyrrolopyrrole Red Coloring Agents)
Pigment Red 254, 255, 264, 270, 272;
(Condensed Azo Red Coloring Agents)
Pigment Red 144, 166, 214, 220, 221, 242;
(Anthraquinone Red Coloring Agents)
Solvent Red 52, 149, 150, 207, Pigment Red 168, 177, 216;
(Quinacridone Red Coloring Agents)
Pigment Red 122, 202, 206, 207, 209.

Other coloring agents of purple, orange, brown, black and the like may also be added for the purpose of adjusting the color tone. Specific examples include Pigment Violet 19, 23, 32, 36, 38, 42, Solvent Violet 13, 36, Pigment Orange 1, 5, 13, 14, 16, 17, 24, 34, 36, 38, 40, 43, 46, 49, 51, 61, 63, 64, 71, 73, Pigment Brown 23, 25, Pigment Black 1, 7, and the like.

In the present embodiment, it is necessary to adjust the total incorporation ratio of the coloring agent and the incorporation ratio of the perylene coloring agent and complementary coloring agent to proportions sufficient for a solder resist layer composed of the obtained photosensitive resin composition or a cured coating film thereof to present a black color. To be specific, as mentioned above, the incorporation ratios of the perylene coloring agent and complementary coloring agent in the photosensitive resin composition may be set respectively in the range of preferably from 0.01 to 8 parts by mass, more preferably from 0.05 to 5 parts by mass with respect to 100 parts by mass of the carboxyl group-containing resin so that the photosensitive resin composition or the cured coating film thereof presents a black color.

In the present embodiment, the black color presented by the photosensitive resin composition and the cured coating film thereof refers to a color having such a color tone that an observer recognizes it as a black-based color by observation by the naked eyes. To be specific, when the appearance color tone of a cured coating film (thickness 18 to 22 µm) of the photosensitive resin composition of the present embodiment is measured and represented by the method as prescribed in JISZ8729, it is preferable that the L* value is 40 or less and the a* value and b* value are each independently in the range of from −5 to 5 in the CIE L*a*b* Color Scale, although the values depend on a pretreatment of copper. More preferably, the L* value is from 10 to 40, and the a* value and b* value that are illimitably closer to 0 are more preferable.

Although the incorporation ratio of the other coloring agents comprising the perylene coloring agent that is in a complementary color relation with the perylene coloring agent cannot be generalized and may be suitably set since it is affected by the kind of the perylene coloring agent used and the kinds of other additives and the like, for example, the incorporation ratio of the red perylene coloring agent and green anthraquinone coloring agent, the incorporation ratio of the red perylene coloring agent and black perylene coloring agent (Pigment Black 31, 32), and the incorporation ratio of the black perylene coloring agent (Pigment Black 31, 32)

and black perylene coloring agent (Lumogen) are preferably in a ratio of from 1:0.01 to 1:20 on the basis of mass ratio.

Next, the respective constitutional components other than the coloring agents included in the photosensitive resin composition of the present embodiment will be explained in detail. For the photosensitive resin composition of the present embodiment, the materials as mentioned below can be used.

(Carboxyl Group-Containing Resin)

A carboxyl group-containing resin having a carboxyl group in a molecule is used for the purpose of imparting alkali developing property in the photosensitive resin composition of the present embodiment, and conventionally-known various compounds can be used. Specifically, a carboxyl group-containing photosensitive resin having an ethylenically unsaturated double bond in a molecule is more preferable from the viewpoints of photo-curing property and developing resistance. Furthermore, the unsaturated double bond is preferably one derived from acrylic acid or methacrylic acid or a derivative thereof.

Specific examples of the carboxyl group-containing resin are preferably the compounds listed below.

(1) Carboxyl group-containing resins obtained by copolymerization of (meth)acrylic acid and an unsaturated group-containing substance.

(2) Carboxyl group-containing urethane resins obtained by an addition polymerization reaction between a diisocyanate, a carboxylic acid-containing dialcohol compound and a diol compound.

(3) Photosensitive carboxyl group-containing urethane resins obtained by an addition polymerization reaction of a diisocyanate, a bifunctional epoxy(meth)acrylate or a partial acid anhydride-modified product thereof, a carboxylic acid-containing dialcohol compound and a diol compound.

(4) Terminal (meth)acrylated carboxyl group-containing urethane resins obtained by adding a compound having one hydroxyl group and one or more (meth)acryl group in a molecule during the synthesis of the resins of the above-mentioned (2) and (3).

(5) Terminal (meth)acrylated carboxyl group-containing urethane resins obtained by adding a compound having one isocyanate group and one or more (meth)acryl group in a molecule during the synthesis of the resins of the above-mentioned (2) and (3).

(6) Photosensitive carboxyl group-containing resins obtained by reacting (meth)acrylic acid with a bifunctional and multifunctional (solid) epoxy resins to add a dibasic acid anhydride to the hydroxyl groups present on the side chains.

(7) Photosensitive carboxyl group-containing resins obtained by reacting (meth)acrylic acid with a multifunctional epoxy resin obtained by further epoxylating the hydroxyl groups of a bifunctional (solid) epoxy resin with epichlorohydrin and adding a dibasic acid anhydride to the generated hydroxyl groups.

(8) Carboxyl group-containing polyester resins obtained by reacting a bifunctional oxetane resin with a dicarboxylic acid, and adding a dibasic acid anhydride to the generated primary hydroxyl groups.

(9) Photosensitive carboxyl group-containing resin obtained by further adding a compound having one epoxy group and one or more (meth)acryl group in a molecule to the above-mentioned resins.

In the present specification, the (meth)acrylate is a generic term used to refer to acrylates, methacrylates and mixtures thereof, and the same applies to other similar expressions.

Since the carboxyl group-containing resin as mentioned above has many free carboxyl groups on the side chains of the backbone polymer, it enables developing with an alkali aqueous solution.

Furthermore, the above-mentioned carboxyl group-containing resin preferably has an acid value in the range of from 40 to 200 mg KOH/g. When the acid value is less than 40 mg KOH/g, it becomes difficult to develop with an alkali, whereas when the acid value exceeds 200 mg KOH/g, dissolution of an exposed part by a developer proceeds and lines get thin more than necessary, and in some cases, an exposed part and an unexposed part are dissolved by a developer and peeled off without distinction and thus drawing of a normal resist pattern becomes difficult. More preferably, the acid value is in the range of from 45 to 120 mg KOH/g.

Furthermore, although the weight average molecular weight of the above-mentioned carboxyl group-containing resin differs depending on the resin backbone, it is generally preferably in the range of from 2,000 to 150,000. When the weight average molecular weight is less than 2,000, tack free performance become poor in some cases, the humidity resistance of a coating after exposure becomes worse, and film thickness loss occurs during developing and resolution is deteriorated significantly in some cases. On the other hand, when the weight average molecular weight exceeds 150,000, developing property becomes worse significantly, and storage stability is deteriorated in some cases. More preferably, the weight average molecular weight is in the range of from 5,000 to 100,000.

The incorporation ratio of such carboxyl group-containing resin is preferably from 20 to 60 mass % in the whole composition. In the case when the incorporation ratio is less than 20 mass %, coating strength is decreased in some cases. On the other hand, in the case when the incorporation ratio is more than 60 mass %, viscosity is increased, or application property and the like are decreased. More preferably, the incorporation ratio is from 30 to 50 mass %.

These carboxyl group-containing resins can be used without being limited to those mentioned above, and they can be used by one kind or by mixing plural kinds.

(Photopolymerization Initiator)

The photosensitive resin composition of the present embodiment comprises a photopolymerization initiator.

As the photopolymerization initiator, it is preferable to use one or more kind selected from the group consisting of oxime ester polymerization initiators, α-aminoacetophenone photopolymerization initiators and acylphosphineoxide photopolymerization initiators.

Examples of the oxime ester photopolymerization initiators may include commercial products such as CGI-325, IRGACURE OXE01 and IRGACURE OXE02 manufactured by Ciba Japan, N-1919 and ADEKA ARKLS NCI-831 manufactured by ADEKA, and TOE Series manufactured by Nippon Chemical Works Co., Ltd.

Specific α-aminoacetophenone photopolymerization initiators may include 2-methyl-1-[4-(methylthio)phenyl]-2-morpholinopropan-1-one, 2-benzyl-2-dimethylamino-1-(4-morpholinophenyl)-butan-1-one, 2-(dimethylamino)-2-[(4-methylphenyl)methyl]-1-[4-(4-morpholinyl)phenyl]-1-butanone, N,N-dimethylaminoacetophenone and the like. Examples of commercial products may include IRGACURE 907, IRGACURE 369 and IRGACURE 379 manufactured by Ciba Japan, and the like.

Examples of the acylphosphineoxide photopolymerization initiators may include 2,4,6-trimethylbenzoyldiphenylphosphineoxide, bis(2,4,6-trimethylbenzoyl)-phenylphosphineoxide, bis(2,6-dimethoxybenzoyl)-2,4,4-trimethyl-pentylphosphineoxide and the like. Examples of commercial products may include LUCIRIN TPO manufactured by BASF, IRGACURE 819 manufactured by Ciba Japan, and the like.

The incorporation ratio of such photopolymerization initiators is preferably from 0.01 to 30 parts by mass with respect to 100 parts by mass of the carboxyl group-containing resin. When the incorporation ratio is less than 0.01 parts by mass, photo-curing property on copper becomes insufficient, which leads to peeling of a coating and deterioration of coating properties such as chemical resistance. On the other hand, when the incorporation ratio exceeds 30 parts by mass, the light absorbance of the photopolymerization initiator on the surface of a solder resist coating becomes intense, and deep portion-curability tends to decrease. More preferably, the incorporation ratio is from 0.5 to 15 parts by mass.

In addition, in the cases of the oxime ester photopolymerization initiators, the incorporation ratio thereof is preferably from 0.01 to 20 parts by mass with respect to 100 parts by mass of the carboxyl group-containing resin. More preferably, the incorporation ratio is in the range from 0.01 to 5 parts by mass.

Furthermore, a photopolymerization initiator other than the compounds mentioned above, a light polymerization-initiation aid and a sensitizer can be used for the photosensitive resin composition of the present embodiment, and examples may include benzoin compounds, acetophenone compounds, anthraquinone compounds, thioxanthone compounds, ketal compounds, benzophenone compounds, xanthone compounds, titanocene compounds and tertiary amine compounds, and the like.

Specific examples of the benzoin compounds include benzoin, benzoin methyl ether, benzoin ethyl ether and benzoin isopropyl ether.

Specific examples of the acetophenone compounds include acetophenone, 2,2-dimethoxy-2-phenylacetophenone, 2,2-diethoxy-2-phenylacetophenone and 1,1-dichloroacetophenone.

Specific examples of the anthraquinone compounds include 2-methylanthraquinone, 2-ethylanthraquinone, 2-t-butylanthraquinone and 1-chloroanthraquinone.

Specific examples of the thioxanthone compounds include 2,4-dimethylthioxanthone, 2,4-diethylthioxanthone, 2-chlorothioxanthone and 2,4-diisopropylthioxanthone.

Specific examples of the ketal compounds include acetophenone dimethyl ketal, benzyl dimethyl ketal and the like.

Specific examples of the benzophenone compounds include benzophenone, 4-benzoyldiphenylsulfide, 4-benzoyl-4'-methyldiphenylsulfide, 4-benzoyl-4'-ethyldiphenylsulfide and 4-benzoyl-4'-propyldiphenylsulfide.

Specific examples of the titanocene compounds include bis($\eta$5-cyclopentadienyl)-bis(2,6-difluoro-3-(1H-pyrrol-1-yl)phenyl)titanium.

Specific examples of the tertiary amine compounds include ethanolamine compounds, compounds having a dialkylaminobenzene structure such as dialkylaminobenzophenones such as 4,4'-dimethylaminobenzophenone (NISSOCURE MABP manufactured by Nippon Soda Co., Ltd.) and 4,4'-diethylaminobenzophenone (EAB manufactured by Hodogaya Chemical Co., Ltd.), dialkylamino group-containing coumarin compounds such as 7-(diethylamino)-4-methyl-2H-1-benzopyran-2-one (7-(diethylamino)-4-methyl-coumarin), ethyl 4-dimethylamino benzoate (KAYACURE EPA manufactured by Nippon Kayaku Co., Ltd.), ethyl 2-dimethylamino benzoate (Quantacure DMB manufactured by International Bio-Synthetics Inc.), (n-butoxy)ethyl 4-dim-ethylamino benzoate (Quantacure BEA manufactured by International Bio-Synthetics Inc.), p-dimethylaminobenzoic acid isoamyl ethyl ester (KAYACURE DMBI manufactured by Nippon Kayaku Co., Ltd.) and 2-ethylhexyl 4-dimethylamino benzoate (Esolol507 manufactured by VanDyk).

Among these, thioxanthone compounds and tertiary amine compounds are preferable. It is preferable to incorporate a thioxanthone compound in view of deep portion-curability.

The incorporation ratio of such thioxanthone compound is preferably 20 parts by mass or less with respect to 100 parts by mass of the carboxyl group-containing resin. When the incorporation ratio of the thioxanthone compound is too much, thick film curability is deteriorated, which leads to increase in the costs for products. More preferably, the incorporation ratio is 10 parts by mass or less.

As the tertiary amine compounds, compounds having a dialkylaminobenzene structure are preferable, of which dialkylaminobenzophenone compounds, and dialkylamino group-containing coumarin compounds having the maximum absorb wavelength at from 350 to 410 nm are specifically preferable.

Among the dialkylaminobenzophenone compounds, 4,4'-diethylaminobenzophenone is preferable since it has low toxicity. Since the dialkylamino group-containing coumarin compounds having the maximum absorb wavelength at from 350 to 410 nm have the maximum absorb wavelength at the ultraviolet area, they provides little coloring, and thus it becomes possible to obtain a colorless and transparent photosensitive composition as well as a colored solder resist film using a coloring agent, which reflects the color of the coloring agent itself. Specifically, 7-(diethylamino)-4-methyl-2H-1-benzopyran-2-one is preferable since it shows an excellent sensitizing effect against laser light at a wavelength of from 400 to 410 nm.

The incorporation ratio of such tertiary amine compound is preferably from 0.1 to 20 parts by mass with respect to 100 parts by mass of the carboxyl group-containing resin. When the incorporation ratio is less than 0.1 part by mass, a sufficient sensitizing effect tends to be unable to be obtained. On the other hand, when the incorporation ratio exceeds 20 parts by mass, light absorption by the tertiary amine compound on the surface of a dry solder resist coating becomes intense and deep portion-curability tends to decrease. More preferably, the incorporation ratio is from 0.1 to 10 parts by mass.

These photopolymerization initiators, light-initiation aids and sensitizers can be used solely or as a mixture of two or more kinds.

(Compound Having Two or More Ethylenically Unsaturated Groups in Molecule)

The photosensitive resin composition of the present embodiment comprises a compound having two or more ethylenically unsaturated groups in a molecule.

The compound having two or more ethylenically unsaturated groups in a molecule is photo-cured by irradiation with active energy ray to insolubilize the carboxyl group-containing resin in an aqueous alkali solution or help the insolubilization.

Examples of such compound may include diacrylates of glycols such as ethylene glycol, methoxytetraethylene glycol, polyethylene glycol and propylene glycol; polyvalent acrylates of polyvalent alcohols such as hexanediol, trimethylolpropane, pentaerythritol and dipentaerythritol and tris-hydroxyethylisocyanurate and ethylene oxide additives or propylene oxide additives thereof; polyvalent acrylates of phenoxyacrylate, bisphenol A diacrylate and ethylene oxide additives or propylene oxide additives of these phenols; polyvalent acrylates of glycidyl ethers such as glycerin diglycidyl ether, glycerin triglycidyl ether, trimethylolpropane triglycidyl ether and triglycidyl isocyanurate; and melamine acrylates and/or respective methacrylates that correspond to the above-mentioned acrylates; and the like.

Furthermore, examples may include epoxy acrylate resins obtained by reacting a multifunctional epoxy resin such as a cresol-novolak type epoxy resin with acrylic acid, epoxyurethane acrylate compounds obtained by further reacting the hydroxyl groups of the epoxy acrylate resins with a half-urethane compound of a hydroxyacrylate such as pentaerythritol triacrylate and isophorone diisocyanate. Such epoxy acrylate resins can improve photo-curability without decreasing touch dryness of fingers.

The incorporation ratio of such compound having two or more ethylenically unsaturated groups in a molecule is preferably from 5 to 100 parts by mass with respect to 100 parts by mass of the carboxyl group-containing resin. In the case when the incorporation ratio is less than 5 parts by mass, photo-curability is decreased, and formation of a pattern becomes difficult by alkali developing after irradiation with an active energy ray. On the other hand, in the case when the incorporation ratio exceeds 100 parts by mass, solubility against an alkali aqueous solution is decreased, and a coating becomes brittle. More preferably, the incorporation ratio is from 1 to 70 parts by mass.

(Thermosetting Component)

A thermosetting component can be added to the photosensitive resin composition of the present embodiment so as to impart heat resistance. A thermosetting component having two or more cyclic ether groups and/or cyclic thioether groups (hereinafter abbreviated as "cyclic (thio)ether groups") in a molecule is specifically preferable.

Such thermosetting component having two or more cyclic (thio)ether groups in a molecule is preferably a compound having two or more of either one or both of 3, 4 or 5-membered cyclic ether groups or cyclic thioether groups in a molecule, and examples may include compounds having at least two or more epoxy groups in a molecule, i.e., multifunctional epoxy compounds, compounds having at least two or more oxetanyl groups in a molecule, i.e., multifunctional oxetane compounds, compounds having two or more cyclic thioether groups in a molecule, i.e., episulfide compounds, and the like.

Examples of the multifunctional epoxy compounds may include, but are not limited to, bisphenol A type epoxy resins such as jER828, jER834, jER1001 and jER1004 manufactured by Japan Epoxy Resins Co., Ltd., EPICLON 840, EPICLON 850, EPICLON 1050 and EPICLON 2055 manufactured by DIC, EPOTOHTO YD-011, EPOTOHTO YD-013, EPOTOHTO YD-127 and EPOTOHTO YD-128 manufactured by Tohto Kasei Co., Ltd., D. E. R. 317, D. E. R. 331, D. E. R. 661 and D. E. R. 664 manufactured by Dow Chemical Company, ARALDIDE 6071, ARALDIDE 6084, ARALDIDE GY250 and ARALDIDE GY260 manufactured by Ciba Japan, SUMI-EPDXY ESA-011, SUMI-EPDXY ESA-014, SUMI-EPDXY ELA-115 and SUMI-EPDXY ELA-128 manufactured by Sumitomo Chemical Co., Ltd., and A. E. R. 330, A. E. R. 331, A. E. R. 661 and A. E. R. 664 manufactured by Asahi Kasei Corporation (all are trade names); brominated epoxy resins such as jERYL903 manufactured by Japan Epoxy Resins Co., Ltd., EPICLON 152 and EPICLON 165 manufactured by DIC, EPOTOHTO YDB-400 and EPOTOHTO YDB-500 manufactured by Tohto Kasei Co., Ltd., D. E. R. 542 manufactured by Dow Chemical Company, ARALDIDE 8011 manufactured by Ciba Japan, SUMI-EPDXY ESB-400 and SUMI-EPDXY ESB-700 manufactured by Sumitomo Chemical Co., Ltd., and A. E. R. 711 and A. E. R. 714 manufactured by Asahi Kasei Corporation (all are trade names); novolak type epoxy resins such as jER152 and jER154 manufactured by Japan Epoxy Resins Co., Ltd., D. E. N. 431 and D. E. N. 438 manufactured by Dow Chemical Company, EPICLON N-730, EPICLON N-770 and EPICLON N-865 manufactured by DIC, EPOTOHTO YDCN-701 and EPOTOHTO YDCN-704 manufactured by Tohto Kasei Co., Ltd., ARALDIDE ECN1235, ARALDIDE ECN1273, ARALDIDE ECN1299 and ARALDIDE XPY307 manufactured by Ciba Japan, EPPN-201, EOCN-1025, EOCN-1020, EOCN-104S and RE-306 manufactured by Nippon Kayaku Co., Ltd., SUMI-EPDXY ESCN-195X and SUMI-EPDXY ESCN-220 manufactured by Sumitomo Chemical Co., Ltd., and A. E. R. ECN-235 and A. E. R. ECN-299 manufactured by Asahi Kasei Corporation (all are trade names); bisphenol F type epoxy resins such as EPICLON 830 manufactured by DIC, jER807 manufactured by Japan Epoxy Resins Co., Ltd., EPOTOHTO YDF-170, EPOTOHTO YDF-175 and EPOTOHTO YDF-2004 manufactured by Tohto Kasei Co., Ltd., and ARALDIDE XPY306 manufactured by Ciba Japan (all are trade names); hydrogenated bisphenol A type epoxy resins such as EPOTOHTO ST-2004, EPOTOHTO ST-2007 and EPOTOHTO ST-3000 manufactured by Tohto Kasei Co., Ltd. (trade names); glycidylamine type epoxy resins such as jER604 manufactured by Japan Epoxy Resins Co., Ltd., EPOTOHTO YH-434 manufactured by Tohto Kasei Co., Ltd., ARALDIDE MY720 manufactured by Ciba Japan and SUMI-EPDXY ELM-120 manufactured by Sumitomo Chemical Co., Ltd. (all are trade names); hydantoin type epoxy resins such as ARALDIDE CY-350 manufactured by Ciba Japan (trade name); alicyclic epoxy resins such as CELOXIDE 2021 manufactured by Daicel Corporation, and ARALDIDE CY175 and ARALDIDE CY179 manufactured by Ciba Japan (all are trade names); trihydroxyphenylmethane type epoxy resins such as YL-933 manufactured by Japan Epoxy Resins Co., Ltd., and T. E. N., EPPN-501 and EPPN-502 manufactured by Dow Chemical Company (all are trade names); bixylenol type or biphenol type epoxy resins such as YL-6056, YX-4000 and YL-6121 manufactured by Japan Epoxy Resins Co., Ltd. (all are trade names) or mixtures thereof; bisphenol S type epoxy resins such as EBPS-200 manufactured by Nippon Kayaku Co., Ltd., EPX-30 manufactured by Asahi Denka Co., Ltd., and EXA-1514 manufactured by DIC (trade names); bisphenol A novolak type epoxy resins such as jER157S manufactured by Japan Epoxy Resins Co., Ltd.; tetraphenylol ethane type epoxy resins such as jERYL-931 manufactured by Japan Epoxy Resins Co., Ltd. and ARALDIDE 163 manufactured by Ciba Japan (all are trade names); heterocyclic epoxy resins such as ARALDIDE PT810 manufactured by Ciba Japan and TEPIC manufactured by Nissan Chemical Industries, Ltd. (all are trade names); diglycidyl phthalate resins such as BLENMER DGT manufactured by NOF Corporation; tetraglycidylxylenoylethane resins such as ZX-1063 manufactured by Tohto Kasei Co., Ltd.; naphthalene group-containing epoxy resins such as ESN-190 and ESN-360 manufactured by Nippon Steel Chemical Co., Ltd., and HP-4032, EXA-4750 and EXA-4700 manufactured by DIC; epoxy resins having a dicyclopentadiene backbone such as HP-7200 and HP-7200H manufactured by DIC; glycidyl methacrylate-co-polymerized epoxy resins such as CP-50S and CP-50M manufactured by NOF Corporation; as well as copolymerized epoxy resins of cyclohexylmaleimide and glycidyl methacrylate; epoxy-modified polybutadiene rubber derivatives (for example, PB-3600 manufactured by Daicel Corporation, and the like), CTBN-modified epoxy resins (for example, YR-102 and YR-450 manufactured by Tohto Kasei Co., Ltd., and the like), and the like. These epoxy resins can be used solely or as a combination of two or more kinds.

Examples of the multifunctional oxetane compounds may include multifunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate and oligomers or copolymers thereof, and etherificated products of oxetane alcohol and novolak resins, poly(p-hydroxystyrene), Cardo type bisphenols, calixarenes, calixresorcinarenes or resins having hydroxyl groups such as silsesquioxane, and the like. Furthermore, copolymers of an unsaturated monomer having an oxetane ring and an alkyl(meth)acrylate may also be included.

Examples of the multifunctional episulfide resins may include YL7000 (bisphenol A type episulfide resin) manufactured by Japan Epoxy Resins Co., Ltd., and the like. Furthermore, an episulfide resin obtained by replacing the oxygen atom in the epoxy group of a novolak type epoxy resin with a sulfur atom by using a similar synthesis method, and the like can also be used.

The incorporation ratio of the thermosetting component having two or more cyclic (thio)ether groups in a molecule is preferably in the range from 0.6 to 2.5 equivalent amount with respect to 1 equivalent amount of the carboxyl group of the carboxyl group-containing resin. In the case when the incorporation ratio is less than 0.6 equivalent amount, the carboxyl groups remain in a solder resist film, thereby heat resistance, alkali resistance, electrical insulating property and the like are decreased. On the other hand, in the case when the incorporation ratio exceeds 2.5 equivalent amount, cyclic (thio)ether groups having a low molecular weight remain in a dry coating, thereby the strength and the like of the coating are decreased. More preferably, the incorporation ratio is in the range of from 0.8 to 2.0 equivalent amount.

In the case when the above-mentioned thermosetting component having two or more cyclic (thio)ether groups in a molecule is used in the photosensitive resin composition of the present embodiment, it is preferable to incorporate a thermosetting catalyst. Examples of such thermosetting catalyst may include imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine and 4-methyl-N,N-dimethylbenzylamine, hydrazine compounds such as adipic acid dihydrazide and sebacic acid dihydrazide; phosphorus compounds such as triphenylphosphine, and the like. Furthermore, examples of commercial products may include 2MZ-A, 2MZ-OK, 2PHZ, 2P4BHZ and 2P4 MHZ manufactured by Shikoku Chemical Corporation (all are trade names of imidazole compounds), U-CAT (registered trademark) 3503N and U-CAT3502T manufactured by San-Apro Ltd. (all are trade names of block isocyanate compounds of dimethylamine), DBU, DBN, U-CATSA102 and U-CAT5002 (all are bicyclic amidine compounds and salts thereof), and the like. Specifically, the thermosetting catalysts are not limited to these and may be thermosetting catalysts of epoxy resins or oxetane compounds, or those promoting the reaction between epoxy groups and/or oxetanyl groups and carboxyl groups, and may be used solely or as a mixture of two or more kinds. Furthermore, guanamine, acetoguanamine, benzoguanamine, melamine, and S-triazine derivatives such as 2,4-diamino-6-methacryloyloxyethyl-S-triazine, 2-vinyl-2,4-diamino-S-triazine, 2-vinyl-4,6-diamino-S-triazine-isocyanuric acid additive and 2,4-diamino-6-methacryloyloxyethyl-S-triazine-iso cyanuric acid additive can also be used, and it is preferable to use these compounds that also act as adhesion-imparting agents and the above-mentioned thermosetting catalyst in combination.

The incorporation ratio of these thermosetting catalysts is sufficient at a general quantitative ratio, and for example, it is preferably from 0.1 to 20 parts by mass, more preferably from 0.5 to 15.0 parts by mass with respect to 100 parts by mass of the carboxyl group-containing resin or the thermosetting component having two or more cyclic (thio)ether groups in a molecule.

A filler can be incorporated in the photosensitive resin composition of the present embodiment as necessary so as to increase the physical strength and the like of a coating thereof. As such filler, known inorganic or organic fillers can be used, and specifically, barium sulfate, spherical silica and talc are preferably used. Furthermore, metal hydroxides such as titanium oxide, metal oxides and aluminum hydroxide can also be used as body pigment fillers. The incorporation ratio of these fillers is preferably 75 mass % or less of the whole amount of the composition. In the case when the incorporation ratio exceeds 75 mass % of the whole amount of the composition, the viscosity of an insulating composition is increased, thereby application and molding properties are decreased, and a cured product becomes brittle. More preferably, the incorporation ratio is a ratio from 0.1 to 60 mass %.

Furthermore, an organic solvent can be used for the photosensitive resin composition of the present embodiment for synthesizing the above-mentioned carboxyl group-containing resin or preparing the composition, or for adjusting the viscosity for applying to a substrate or carrier film.

Examples of such organic solvent may include ketones, aromatic hydrocarbons, glycol ethers, glycol ether acetates, esters, alcohols, aliphatic hydrocarbons, petroleum solvents and the like. More specifically, the examples include ketones such as methyl ethyl ketone and cyclohexanone; aromatic hydrocarbons such as toluene, xylene and tetramethylbenzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and triethylene glycol monoethyl ether; esters such as ethyl acetate, butyl acetate, dipropylene glycol methyl ether acetate, propylene glycol methylether acetate, propylene glycol ethyl ether acetate, propylene glycol butyl ether acetate, methyl lactate and ethyl lactate butyl lactate; alcohols such as ethanol, propanol, ethylene glycol and propylene glycol; aliphatic hydrocarbons such as octane and decane; petroleum solvents such as petroleum ether, petroleum naphtha, hydrogenated petroleum naphtha and solvent naphtha; and the like. Such organic solvents are used solely or as a mixture of two or more kinds.

The photosensitive resin composition of the present embodiment can further include as necessary known additives such as known heat polymerization inhibitors such as hydroquinone, hydroquinone methyl ether, t-butylcatechol, pyrogallol and phenotiazine, known thickening agents such as micropowder silica, organic bentonite and montmorillonite, defoaming agents such as silicone, fluorine and polymer defoaming agents and/or leveling agents, antioxidants and anticorrosives.

EXAMPLES

Hereinafter the present embodiment will be explained with referring to Examples and Comparative Examples, but it is needless to say that the present invention is not limited by the following Examples. In addition, unless otherwise indicated, the "part(s)" represents "part (s) by mass" in all of the following cases.

<Carboxyl Group-Containing Resin>

220 parts of a cresol novolak type epoxy resin ("EPICLON N-695" manufactured by DIC, epoxy equivalent amount: 220) was put into a four-necked flask equipped with a stirrer and a reflux condenser, and 214 parts of carbitol acetate was added thereto and dissolved by heating. Next, 0.46 part of hydroquinone as a polymerization inhibitor and 1.38 parts of triphenylphosphine as a reaction catalyst were added. This mixture was heated to from 95 to 105° C., 72 parts of acrylic acid was gradually added dropwise, and the mixture was reacted for 16 hours. This reaction product was cooled to from 80 to 90° C., 106 parts of tetrahydrophthalic acid anhydride was added, the mixture was reacted for 8 hours and cooled, and the reaction solution (this is referred to as "varnish") was then taken out. The carboxyl group-containing resin obtained by such way had an acid value of a solid of 100 mg KOH/g and a nonvolatile content of 65%.

Compounding Example

The following components were pre-mixed in a stirrer at the following incorporation amounts and kneaded in a triple roll mill, thereby respective photosensitive resin compositions for solder resists (Examples 1 to 6 and Comparative Examples 1 to 4) were prepared. In addition, the dispersion degrees of the obtained photosensitive resin compositions were evaluated by particle size measurement by using a grindometer manufactured by Eriksen and were found to be 15 µm or less.

TABLE 1

| Composition (Parts by mass) | | | Examples | | | | | | Comparative Examples | | | |
|---|---|---|---|---|---|---|---|---|---|---|---|---|
| | | | 1 | 2 | 3 | 4 | 5 | 6 | 1 | 2 | 3 | 4 |
| Colorants | Perylene | *1 | 1 | 2 | 1 | | 2 | | | | | |
| | Colorants | *2 | | | 3 | 1 | | | 3 | | | |
| | | *3 | | | | 0.8 | | 4 | | 3 | | |
| | | *4 | | 0.5 | | | 0.5 | 0.5 | | | | 3 |
| | Anthraquinone colorant *5 | | 2 | | | | | | | | | |
| | Phthalocyanine blue *6 | | | 1.5 | | | | 1 | | | | |
| | Carbon Black *7 | | | | | | 1.5 | | | | 0.7 | |
| Varnish | | | 154 | 154 | 154 | 154 | 154 | 154 | 154 | 154 | 154 | 154 |
| Photopolymerization initiators | | *8 | 10 | 10 | 10 | 10 | 2 | 10 | 10 | 10 | 10 | 10 |
| | | *9 | 1 | 1 | 1 | 1 | | 1 | 1 | 1 | 1 | 1 |
| | | *10 | | | | | 1 | | | | | |
| Thermosetting resin | | *11 | 20 | 20 | 20 | 20 | 20 | 20 | 20 | 20 | 20 | 20 |
| | | *12 | 30 | 30 | 30 | 30 | 30 | 30 | 30 | 30 | 30 | 30 |
| DPHA *13 | | | 20 | 20 | 20 | 20 | 20 | 20 | 20 | 20 | 20 | 20 |
| Dicyandiamide *14 | | | 0.3 | 0.3 | 0.3 | 0.3 | 0.3 | 0.3 | 0.3 | 0.3 | 0.3 | 0.3 |
| Barium sulfate *15 | | | 100 | 100 | 100 | 100 | 100 | 100 | 100 | 100 | 100 | 100 |
| Orgnic bentonite *16 | | | 10 | 10 | 10 | 10 | 10 | 10 | 10 | 10 | 10 | 10 |
| Silicone defoaming agent *17 | | | 3 | 3 | 3 | 3 | 3 | 3 | 3 | 3 | 3 | 3 |
| Organic solvent *18 | | | 20 | 20 | 20 | 20 | 20 | 20 | 20 | 20 | 20 | 20 |

[Notes]
* 1: Pigment Red 149
* 2: Pigment Black 31
* 3: Lumogen Black FK4281
* 4: Solvent Green 5
* 5: Solvent Green 3
* 6: Pigment Blue 15:3
* 7: Pigment Black 7
* 8: 2-Benzyl-2-dimethylamino-1-(4-morpholinophenyl)-butan-l-one (manufactured by Ciba Japan; IRGACURE 369)
* 9: Bis(η5-cyclopentadienyl)-bis(2, 6-difluoro-3-(1H-pyrrol-1-yl)phenyl) titanium (manufactured by Ciba Japan; IRGACURE 784)
* 10: Oxime ester photopolymerization initiator (manufactured by ADEKA: ADEKA ARKLS NCI-831)
* 11: Phenol novolak type epoxy resin (manufactured by Dow Chemical Company; DEN-431)
* 12: Bixylenol type epoxy resin (manufactured by Japan Epoxy Resins Co., Ltd.; YX-4000)
* 13: Dipentaerythritol hexaacrylate (manufactured by Nippon Kayaku Co., Ltd.; DPHA)
* 14: Dicyandiamide (manufactured by Japan Epoxy Resins Co., Ltd.)
* 15: Barium sulfate (manufactured by Sakai Chemical Industries Co., Ltd.; B30)
* 16: Organic bentonite (manufactured by Elementis Japan)
* 17: Silicone defoaming agent (manufactured by Shin-Etsu Chemical Co., Ltd.)
* 18: Dipropylene glycol monomethyl ether (manufactured by Dow Chemical Company Japan; DPM)

Evaluation of Solder Resist Performance:
(Method for Preparing Substrate for Evaluation)

The photosensitive resin compositions of Examples 1 to 6 and Comparative Examples 1 to 4 obtained as above were each applied to the whole surface of a patterned copper foil substrate, dried at 80° C. for 30 minutes, and allowed to cool to room temperature. A solder resist pattern was exposed on this substrate at the optimum exposure amount by using an exposing device comprising a metal halide lamp mounted thereon (manufactured by Orc Manufacturing Co., Ltd.), and developed by using 30° C. of a 1 wt % aqueous sodium carbonate solution under a condition of a spraying pressure of 0.2 MPa for 60 seconds to give a resist pattern. This substrate was cured by heating at 150° C. for 60 minutes. The following properties were evaluated on the obtained printed substrate (substrate for evaluation).

<Color Tone and L*a*b* Values>

The cured coatings of the photosensitive resin compositions of Examples 1 to 6 and Comparative Examples 1 to 4 were prepared according to the above-mentioned method for the preparation of the substrate for evaluation. The film thickness was prepared so that the film thickness after drying became 20±2 μm. The color of the obtained cured coating was measured by using a spectrophotometer. CM-2600d manufactured by KONICA MINOLTA was used as the spectrophotometer, and the CIE L*a*b* was used as a color scale. The value obtained by measuring by an SCI mode on a homogeneous coating surface on a copper foil substrate was defined as a color value. The result of the evaluation is shown in Table 2.

<Optimal Exposure Amount>

A copper clad laminate substrate is polished by using a buffing roll, washed with water and dried, and the photosensitive resin compositions of Examples 1 to 6 and Comparative Examples 1 to 4 are each applied thereto by a screen printing process and dried in a hot air circulation drying oven at 80° C. for 30 minutes. After the drying, the substrate was exposed via a photomask (Step Tablet No. 2 manufactured by Eastman Kodak) by using an exposure machine comprising a metal halide lamp mounted thereon (manufactured by Orc Manufacturing Co., Ltd.). The irradiated product as a test piece was developed by using a developer (a 1 wt % aqueous sodium carbonate solution) at a spraying pressure of 2 kg/cm$^2$ for 60 seconds, and the number of layers of the remaining coating was determined by visual observation. The exposure amount at which the number of layers of the remaining coating became 6 was used as a suitable exposure amount. The result of the evaluation is shown in Table 2.

screen printing process, and dried in a hot air circulation drying oven at 80° C. for 30 minutes. After the drying, the substrate was exposed by using a high-pressure mercury lamp exposure device. As an exposure pattern, a pattern in which lines of 30/40/50/60/70/80/90/100 μm are drawn in a space portion was used. The exposure amount was an exposure amount obtained by evaluating the optimal exposure amount. After the exposure, the substrate was developed by using a 1 wt % aqueous sodium carbonate solution of 30° C. at a spraying pressure of 0.2 MPa for 60 seconds to form a pattern, and the width of the remaining minimum line was used as resolution property.

Figure 2:
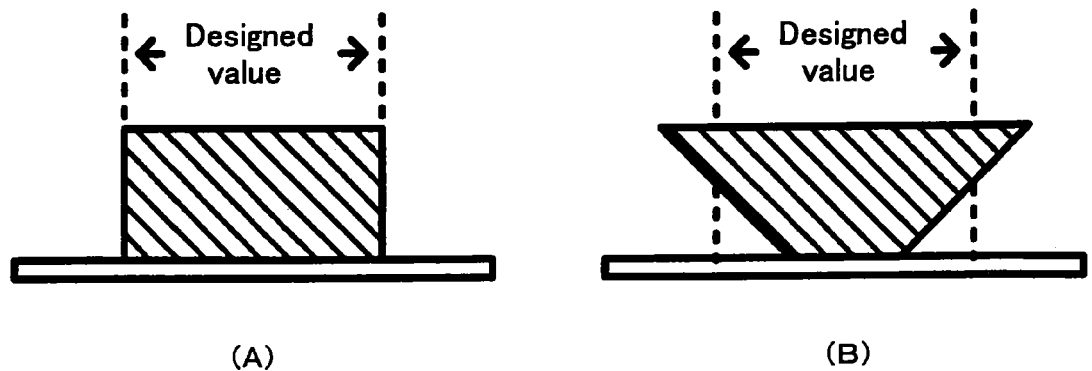
FIG. 2 is a schematic drawing showing the shapes of the cross-sectional surfaces of the patterns formed by the cured coating of the photosensitive resin composition, of which (A) shows an ideal state in which linearity in accordance with a designed width could be obtained in the depth direction, and (B) shows an undercut state.

Furthermore, the substrate was cured by heating at 150° C. for 60 minutes to give a cured coating, and the cross-sectional surface of the line part of the cured coating at a designed value of 100 μm was observed. This cross-sectional surface shape was evaluated by roughly classifying as shown in the schematic drawings described in FIG. 2. FIG. 2 shows schematic drawings in the cases when the following phenomena occur. Specifically, in the case of the evaluation ○, declination from the designed value was within 5 μm at both the upper and lower parts of the line. The evaluation x means a degree at which undercut occurs and the solder resist can be used but has room for improvement. The result is shown in Table 2.

○; An ideal state in which linearity in accordance with a designed width can be obtained in the depth direction (see FIG. 2(A))

x; An undercut state (see FIG. 2(B))

<Light Absorbance>

The photosensitive resin compositions of Examples 1 to 6 and Comparative Examples1 to 4 were each applied to the whole surface of a glass plate so as to became 20±2 μm as a dry coating, dried at 80° C. for 30 minutes, and allowed to cool to room temperature. This glass substrate was set on an ultraviolet-visible spectrometer, an absorption spectrum at the 405±5 nm part was measured, and a light absorbance at 405 nm was calculated.

TABLE 2

| | | | Examples | | | | | Comparative Examples | | |
|---|---|---|---|---|---|---|---|---|---|---|
| | | | | | | | | | 2 | | |
| Evaluation | 1 | 2 | 3 | 4 | 5 | 6 | 1 | Purple- | 3 | 4 |
| Color tone | Black | Black | Black | Black | Black | Black | Green | black | Black | Orange |
| L* | 33 | 33 | 31 | 32 | 33 | 29 | 41 | 32 | 27 | 50 |
| a* | −1 | −0.9 | −2 | 0.8 | −0.9 | 0.1 | −6 | 7 | 0.3 | 15 |
| b* | 3 | 2 | 5 | 1.5 | 2 | −1 | 6 | −1 | 0.4 | 25 |
| Absorbance (405 nm) | 0.3 | 0.3 | 0.3 | 0.3 | 0.3 | 0.3 | 0.2 | 0.3 | 1.1 | 0.3 |
| Optimal exposure amount On resist (mJ/cm$^2$) | 300 | 300 | 300 | 300 | 100 | 300 | 200 | 300 | 500 | 300 |
| Resolution property (μm) | 30 | 30 | 30 | 30 | 30 | 30 | 30 | 30 | 50 | 30 |
| Shape of cross-sectional surface of line | ○ | ○ | ○ | ○ | ○ | ○ | ○ | ○ | x | ○ |

<Resolution Property and Cross-Sectional Surface Shape of Line>

A substrate obtained by forming a circuit pattern with line/space of 300/300 on a copper clad laminate board having a copper thickness of 35 μm, which was polished by a buffing roll as a pretreatment, washed with water and dried, was used as a substrate. The photosensitive resin compositions of Examples 1 to 6 and Comparative Examples 1 to 4 were each applied to the above-mentioned pretreated substrate by a <Solder Heat Resistance>

Cured coatings of the photosensitive resin compositions of Examples 1 to 6 and Comparative Examples 1 to 4 were each prepared according to the above-mentioned method for the preparation of the substrate for evaluation. The film thickness was adjusted so that the film thickness after drying became 20±2 μm.

The coating was soaked into a solder bath at 260° C. for 10 seconds, which was repeated three times, and the peeling and discoloration of the coating were confirmed by visual observation. As a result, no peeling or discoloration was confirmed in all of the substrates for evaluation prepared by using Examples 1 to 6 and Comparative Examples 1 to 4.

<Evaluation as Dry Film>

The photosensitive resin compositions of Example 2 and Comparative Example 1 were each diluted with methyl ethyl ketone and applied to a carrier film. This was dried under heating to form a photosensitive resin composition layer having a thickness of 20 µm, and the layer was dried in a hot air drier at 80° C. for 30 minutes. Furthermore, a cover film was attached to the obtained coating to give a dry film. The cover film was thereafter peeled off, the obtained film was heat-laminated on a patterned copper foil substrate and then exposed in a similar manner by using an exposure device comprising a metal halide lamp mounted thereon (manufactured by Orc Manufacturing Co., Ltd.). After the exposure, the carrier film was peeled off, and the substrate was cured by heating in a hot air drier at 150° C. for 60 minutes to prepare a test substrate. For the obtained test substrate having a cured coating, evaluation tests on the respective properties were conducted according to similar test methods and evaluation methods to those for the above-mentioned compositions. The result was similar to the evaluation result for Example 2 and Comparative Example 1 shown in Table 1.

What is claimed is:

1. A photosensitive resin composition, comprising:
    a coloring agent consisting of at least one perylene pigment;
    a complementary coloring agent consisting of at least one pigment and having a complementary color relation with the coloring agent;
    a carboxyl group-containing resin;
    a compound having a plurality of ethylenically unsaturated groups in a molecule; and
    a photopolymerization initiator,
    wherein each of the coloring agent and the complementary coloring agent is included in an amount of 0.01 to 8.0 parts by mass with respect to 100 parts by mass of the carboxyl group-containing resin, and the complementary color relation is defined such that each of a* value and b* value representing a color in L*a*b* Color Scale is in a range of from −5 to +5 when appearance color tone of a cured product of a dry coating of the photosensitive resin composition having a film thickness in a range of from 18 to 22 µm is measured and represented by a method prescribed in JIS Z8729.

2. The photosensitive resin composition according to claim 1, wherein the dry coating of the photosensitive resin composition having the film thickness in a range of from 18 to 22 µm has an absorbance of 0.5 or less at a wavelength in a range of from 400 to 410 nm, and the cured product of the dry coating has L* value of CIE L*a*b* Color Scale in a range of 40 or less and the a* value and the b* value each independently in the range of from −5 to +5.

3. A dry film, comprising:
    a dry coating obtained by applying a photosensitive resin composition according to claim 1 on a film and drying the photosensitive resin composition on the film.

4. A dry film, comprising:
    a dry coating obtained by applying a photosensitive resin composition according to claim 2 on a film and drying the photosensitive resin composition on the film.

5. A cured product obtained by photo-curing a dry coating by active energy ray irradiation, wherein the dry coating is obtained by applying a photosensitive resin composition according to claim 1 on a substrate and drying the photosensitive resin composition according to claim 1 on the substrate.

6. A cured product obtained by photo-curing a dry coating by active energy ray irradiation, wherein the dry coating is obtained by applying a photosensitive resin composition according to claim 2 on a substrate and drying the photosensitive resin composition according to claim 2 on the substrate.

7. A cured product obtained by photo-curing a dry coating by active energy ray irradiation, wherein the dry coating is obtained by applying a photosensitive resin composition according to claim 1 on a film, drying the photosensitive resin composition according to claim 1 on the film, and laminating the dry coating on a substrate.

8. A cured product obtained by photo-curing a dry coating by active energy ray irradiation, wherein the dry coating is obtained by applying a photosensitive resin composition according to claim 2 on a film, drying the photosensitive resin composition according to claim 2 on the film, and laminating the dry coating on a substrate.

9. A printed wiring board, comprising:
    a cured product having a pattern and obtained by photo-curing a dry coating by active energy ray irradiation,
    wherein the dry coating is obtained by applying a photosensitive resin composition according to claim 1 on a substrate and drying the photosensitive resin composition according to claim 1 on the substrate.

10. A printed wiring board, comprising:
    a cured product having a pattern and obtained by photo-curing a dry coating by active energy ray irradiation,
    wherein the dry coating is obtained by applying a photosensitive resin composition according to claim 2 on a substrate and drying the photosensitive resin composition according to claim 2 on the substrate.

11. A printed wiring board, comprising:
    a cured product having a pattern and obtained by photo-curing a dry coating by active energy ray irradiation,
    wherein the dry coating is obtained by applying a photosensitive resin composition according to claim 1 on a film, drying the photosensitive resin composition according to claim 1 on the film, and laminating on a substrate a coating obtained by the drying.

12. A printed wiring board, comprising:
    a cured product having a pattern and obtained by photo-curing a dry coating by active energy ray irradiation,
    wherein the dry coating is obtained by applying a photosensitive resin composition according to claim 2 on a film, drying the photosensitive resin composition according to claim 2 on the film, and laminating on a substrate a coating obtained by the drying.

13. The photosensitive resin composition according to claim 1, wherein each of the coloring agent and the complementary coloring agent is included in an amount of 0.05 to 5.0 parts by mass with respect to 100 parts by mass of the carboxyl group-containing resin.

14. The photosensitive resin composition according to claim 1, wherein the carboxyl group-containing resin is included in an amount of from 20 to 60 mass % in the photosensitive resin composition.

15. The photosensitive resin composition according to claim 1, wherein the carboxyl group-containing resin is included in an amount of from 30 to 50 mass % in the photosensitive resin composition.

16. The photosensitive resin composition according to claim 1, wherein the compound having a plurality of ethylenically unsaturated groups in a molecule is included in an amount of 5 to 100 parts by mass with respect to 100 parts by mass of the carboxyl-group containing resin.

17. The photosensitive resin composition according to claim 1, wherein the complementary color relation is defined such that each of a* value and b* value representing a color in L*a*b* Color Scale is in a range of from −2 to +2 when appearance color tone of a cured product of a dry coating of the photosensitive resin composition having a film thickness in a range of from 18 to 22 μm is measured and represented by a method prescribed in JIS Z8729.

18. The photosensitive resin composition according to claim 1, wherein the cured product of the dry coating of the photosensitive resin composition having a film thickness in a range of from 18 to 22 μm has a black color.

\* \* \* \* \*